(12) United States Patent
Chen et al.

(10) Patent No.: US 9,944,040 B2
(45) Date of Patent: Apr. 17, 2018

(54) BACK PLATE COMPONENT APPLICABLE TO DISPLAY DEVICE AND DISPLAY DEVICE

(71) Applicants: Hisense Electric Co., Ltd., Qingdao (CN); HISENSE USA CORPORATION, Suwanee, GA (US); Hisense International Co., Ltd., Qingdao (CN)

(72) Inventors: Youcai Chen, Qingdao (CN); Minhua Li, Qingdao (CN)

(73) Assignees: HISENSE ELECTRIC CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 601 days.

(21) Appl. No.: 14/580,526

(22) Filed: Dec. 23, 2014

(65) Prior Publication Data
US 2016/0088744 A1 Mar. 24, 2016

(30) Foreign Application Priority Data
Sep. 18, 2014 (CN) .......................... 2014 1 0477580

(51) Int. Cl.
*B32B 3/08* (2006.01)
*B32B 3/14* (2006.01)
(Continued)

(52) U.S. Cl.
CPC ............... *B32B 3/085* (2013.01); *B32B 3/14* (2013.01); *B32B 3/16* (2013.01);
(Continued)

(58) Field of Classification Search
CPC .. B32B 3/085; B32B 3/14; B32B 3/16; B32B 3/10; G02F 1/133308; G02F 1/133314;
(Continued)

(56) References Cited

U.S. PATENT DOCUMENTS

| 2003/0038902 A1* | 2/2003 | Nitto | G02F 1/133308 |
| | | | 349/58 |
| 2006/0158897 A1* | 7/2006 | Choi | G02F 1/133308 |
| | | | 362/561 |

(Continued)

OTHER PUBLICATIONS

Azo Materials, "Properties of Stainless Steel", Oct. 13, 2012, http://www.azom.com/properties.aspx?ArticleID=863.*

*Primary Examiner* — Samir Shah
*Assistant Examiner* — Jasper Saberi
(74) *Attorney, Agent, or Firm* — Harness, Dickey & Pierce, P.L.C.

(57) ABSTRACT

A back plate component applicable to a display device is disclosed, wherein at least one reinforcement piece is arranged on the back plate component, the reinforcement piece is left-and-right symmetric with respect to a central axis of a length of the back plate component, and a width of the reinforcement piece in a direction of the central axis of the length is decremented from a middle to both of the sides thereof, wherein the central axis of the length of the back plate component is a central axis perpendicular to a length direction of the back plate component and parallel to a width direction of the back plate component.

18 Claims, 4 Drawing Sheets

(51) Int. Cl.
  *B32B 3/16* (2006.01)
  *G02F 1/1333* (2006.01)
  *H05K 5/02* (2006.01)
  *B32B 3/10* (2006.01)
  *H04N 5/64* (2006.01)
  *H04N 5/66* (2006.01)

(52) U.S. Cl.
  CPC .. *G02F 1/133305* (2013.01); *G02F 1/133308* (2013.01); *B32B 3/10* (2013.01); *H04N 5/64* (2013.01); *H04N 5/66* (2013.01); *H05K 5/0204* (2013.01)

(58) Field of Classification Search
  CPC ....... G02F 1/1333; G02F 2001/133314; G02F 1/133305; G02F 2201/56; H04N 5/655; H05K 1/0281; H05K 5/0204; H05K 5/0217; G06F 2200/161; G06F 2200/1612
  See application file for complete search history.

(56) References Cited

U.S. PATENT DOCUMENTS

| | | | |
|---|---|---|---|
| 2009/0121096 A1* | 5/2009 | Nonaka | H05K 5/02 248/158 |
| 2009/0257181 A1* | 10/2009 | Ha | H01L 51/5237 361/679.26 |
| 2010/0079942 A1* | 4/2010 | Yamamoto | G02F 1/133308 361/690 |
| 2011/0013112 A1* | 1/2011 | Yaguchi | G02F 1/133305 349/58 |
| 2014/0118910 A1* | 5/2014 | Sung | G09F 9/301 361/679.01 |

* cited by examiner

BACK PLATE COMPONENT APPLICABLE TO DISPLAY DEVICE AND DISPLAY DEVICE

CROSS-REFERENCE TO RELATED APPLICATION

This application claims the benefit and priority of Chinese Patent Application No. 201410477580.3 filed Sep. 18, 2014. The entire disclosure of the above application is incorporated herein by reference.

FIELD

The present disclosure relates to the field of display technologies and particularly to a back plate component applicable to display device and a display device.

BACKGROUND

This section provides background information related to the present disclosure which is not necessarily prior art.

Display devices include a liquid crystal display device, an LED display device, etc. The display devices may be widely applied to a television set, a computer, a PAD, a mobile phone and other various terminals.

A display device typically includes a back plate component which may function to stabilize or fasten the display device or some components thereof.

The display devices may include a flat panel display device, a curved display device, etc., where the flat panel display device may be a flat panel TV set, computer, PAD, mobile phone or another terminal, for example, and the curved display device may be a curved TV set, computer, PAD, mobile phone or another terminal, for example.

SUMMARY

This section provides a general summary of the disclosure, and is not a comprehensive disclosure of its full scope or all of its features.

In an aspect, one or more embodiments of the disclosure provide a back plate component applicable to a display device, wherein at least one reinforcement piece is arranged on the back plate component, the reinforcement piece is left-and-right symmetric with respect to a central axis of a length of the back plate component, and a width of the reinforcement piece in a direction of the central axis of the length is decremented from a middle to both of the sides thereof, wherein the central axis of the length of the back plate component is a central axis perpendicular to a length direction of the back plate component and parallel to the width direction of the back plate component.

In another aspect, one or more embodiments of the disclosure further provide a back plate component applicable to a display device, wherein at least one reinforcement piece is arranged on the back plate component, a length of the reinforcement piece is no larger than a length of the back plate component, and a width of the reinforcement piece is no larger than a width of the back plate component; and a length direction of the reinforcement piece is parallel to a length direction or a width direction of the back plate component, and a width direction of the reinforcement piece is parallel to the width direction or the length direction of the back plate component.

In still another aspect, one or more embodiments of the disclosure further provide a display device including a back plate component, wherein at least one reinforcement piece is arranged on the back plate component, a length of the reinforcement piece is no larger than a length of the back plate component, and a width of the reinforcement piece is no larger than a width of the back plate component; and a length direction of the reinforcement piece is parallel to a length direction or a width direction of the back plate component, and a width direction of the reinforcement piece is parallel to the width direction or the length direction of the back plate component.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

In order to better understand the technical solutions above, the technical solutions above will be described below with reference to the drawings and one or more embodiments thereof.

Figure 1:
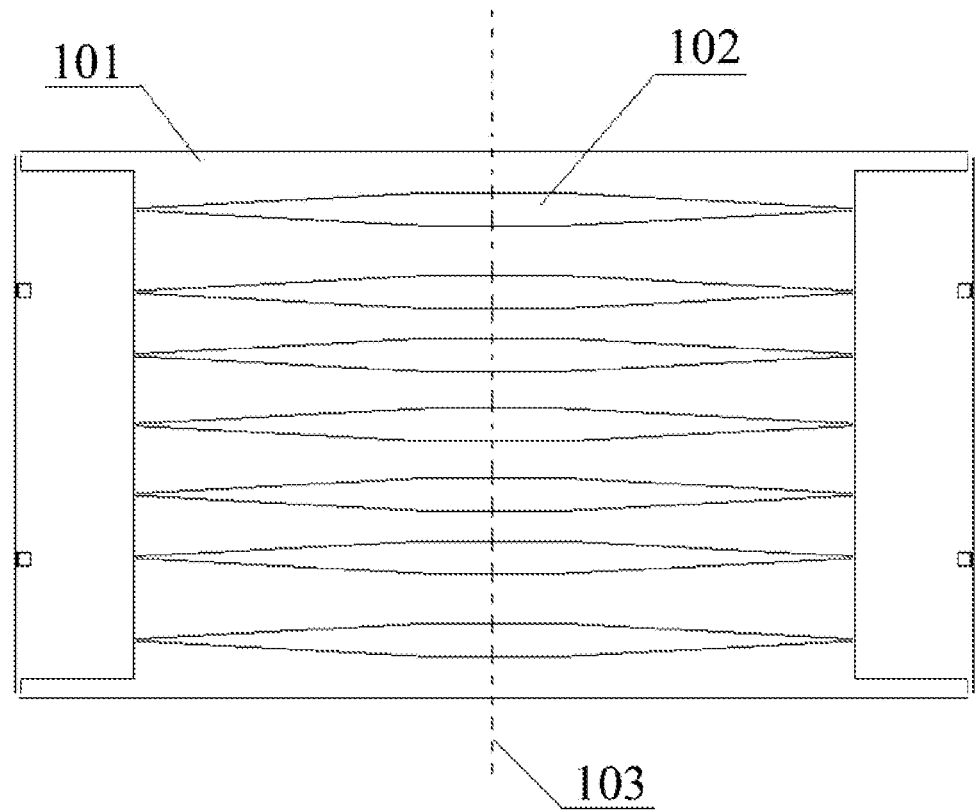
FIG. 1 is a schematic structural diagram of a back plate component according to one or more embodiments of the disclosure.

One or more embodiments of the disclosure provides a back plate component applicable to a display device, and as illustrated in FIG. 1, the back plate component may be applicable to a display device which may be a flat panel display device, e.g., a flat panel TV set, computer, PAD, mobile phone or another terminal, and a curved display device, e.g., a curved TV set, computer, PAD, mobile phone or another terminal.

The back plate component 101 according to one or more embodiments of the disclosure may be in a planar state or a curved state, and the back plate component according to one or more embodiments of the disclosure may be applicable to a curvature-invariable display device or a curvature-adjustable display device. The back plate component 101 may be arranged with at least one reinforcement piece 102 which may be left-and-right symmetric with respect to the central axis 103 of the length of the back plate component 101, and moreover the width of the reinforcement piece 102 in the direction of the central axis 103 of the length may be decremented from the middle to both of the sides thereof, where the central axis 103 of the length is a central axis perpendicular to the length direction of the back plate component 101 and parallel to the width direction of the back plate component 101. Particularly in some embodiments, the reinforcement piece 102 may be attached on the back plate component 101.

In one or more embodiments of the disclosure, for the flat panel display device, the reinforcement piece may be arranged on the back plate component to thereby enhance the bending strength of the back plate component and further improve the stability of the display device. For the curved display device, the reinforcement piece may be arranged on the back plate component to thereby fasten the back plate component so that a display screen or another component in the display device may be curved along with the back plate component being curved.

The application of a back plate component according to one or more embodiments of the disclosure to a display device which may be curved may be described as an example.

The reinforcement piece 102 may be arranged on the back plate component 101 in a number of ways, for example, the reinforcement piece 102 may be attached on the back plate component 101 so that when the back plate component is curved, a tensile force of the reinforcement piece 102 may be applied to the curved part of the back plate component and further to the back plate component 101 to thereby ensure smooth curving of the back plate component 101 due to the tensile force of the reinforcement piece 102.

Typically the reinforcement piece 102 may be arranged on one surface of the back plate component 101 away from the display screen or of course may be arranged on the other surface of the back plate component 101 proximate to the display screen or the reinforcement piece 102 may be arranged on both surfaces of the back plate component 101 away from the display screen and proximate to the display screen, and the disclosure will not be limited in this regard but the reinforcement piece or pieces 102 may be arranged freely for different curved display devices.

For the curvature-adjustable display device, the body of the back plate component 101 may be embodied as a generally flattened stainless steel plate, aluminum plate, iron plate or another plate made of a metal material or as a plastic plate, where all of these materials may be bendable so that the back plate component may be curved. The back plate component 101 may be curved by a rotating shaft, a lever combined with a motor, etc., applying a force thereto.

In one or more embodiments of the disclosure, several reinforcement pieces 102 may be soldered at particular locations on the back of the back plate component 101. Moreover in order to ensure similar curved states of the back plate component on the left and right sides thereof, the reinforcement piece 102 may be further arranged left-and-right symmetric with respect to the central axis 103 of the length of the back plate component 101 so that the curved states of the back plate component 101 on the left and right sides thereof are substantially the same with respect to the central axis 103 of the length, and thus the curved arc of the back plate component appears substantially symmetric, and the width of the reinforcement piece 102 in the direction of the central axis 103 of the length is decremented from the middle to both of the sides thereof.

Figure 2:
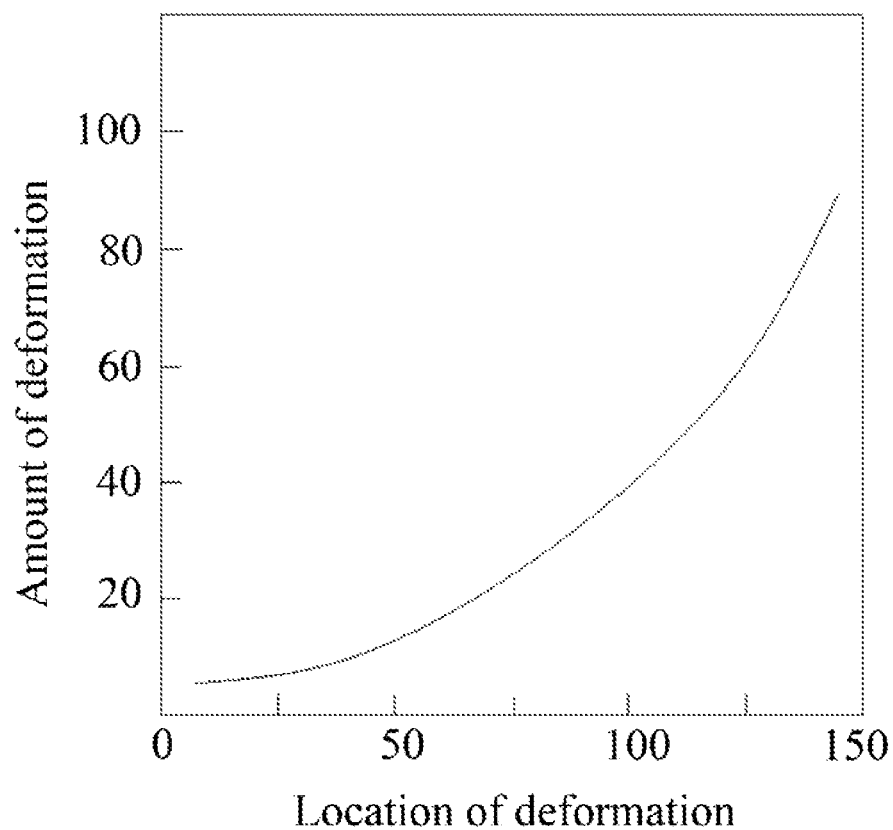
FIG. 2 is a schematic diagram of a result of simulation by CAE software according to one or more embodiments of the disclosure.

Moreover as verified by CAE simulation and a real test, FIG. 2 illustrates a schematic diagram of a result of simulation by CAE software, and in the simulation test, a half of the back plate component on one side with respect to the central axis of the length was tested, where the half of the back plate component was divided into 150 test points on average, and measurements were made at the respective points, and then a deformed curve were plotted. Evidently the back plate component was curved in a smooth shape which was approximately rounded. As may be apparent from the simulation graph, a uniform force may be applied to the respective parts of the back plate component with the reinforcement piece so that the curved arc of the back plate component may be smooth.

Of course, the optimum location, thickness and size of the reinforcement piece 102 may be adjusted for different curved display devices.

The back plate component according to at least one or more embodiments of the disclosure may be applicable to a curved display device of liquid crystals or may be applicable to a self-illuminating curved display product, and with the technical solution according to these embodiments of the disclosure, the curved arc of the back plate component may be smooth to thereby lower both the possibilities of breaking and convexity of the back plate component being curved and the ratio of defective products occurring. In addition to these, at least one or more embodiments of the disclosure may further bring the following advantages: on one hand, for the back plate component according to at least one or more embodiments of the disclosure, neither sophisticated tool nor facility to test the curvature will be required as long as the product in use may be designed reasonably, thus simplifying a test procedure and saving a cost of manual inspection; and on the other hand, for the back plate component according to at least one or more embodiments of the disclosure, the back plate component may be curved by applying a force to both of the sides thereof or other parts thereof, and with the back plate component being protected by the reinforcement piece 102, it will not be necessary to customize an assisting tool for protection of the back plate component, thus facilitating preparation for producing the curved display device, facilitating a turnover of the product and improving the yield.

Moreover taking a 55-inch display device as an example, as demonstrated by a result of CAE simulation and a real test on the product, for the 55-inch display device, if the number of reinforcement pieces is larger than or equal to six, then the thickness of each of the reinforcement pieces 102 may preferably range from 0.6 mm to 1.5 mm, where if the thickness is below 0.6 mm, then the curved arc may be controlled weakly by the reinforcement piece 102 so that a desired smooth effect may be unachievable, whereas if the thickness is above 1.5 mm, the curved arc may be controlled excessively by the reinforcement piece 102 so that the back plate component may have to be curved against the constraint of the bending strength of the thick reinforcement piece. Thus in some embodiments, the thickness of the reinforcement piece may range from 0.6 mm to 1.5 mm so that on one hand, the cost may be saved and a waste of materials may be avoided; and on the other hand, the curving effect of the back plate component may be optimum in this range of thicknesses. It shall be appreciated that the thickness of the reinforcement piece may be determined by the size of the product and the number of reinforcement pieces instead of being a nominal value.

Optionally in order to further ensure the respective parts throughout the back plate component to be curved smoothly, the length of the reinforcement piece 102 may be equal to the length of the back plate component 101. If a plurality of reinforcement pieces 102 are arranged on the back plate component 101, then the reinforcement pieces 102 may be arranged to a longer one and a shorter one being arranged alternatively, and the disclosure will not be limited in this regard. Moreover the plurality of reinforcement pieces 102 may be not identical in size and thickness. Moreover the plurality of reinforcement pieces may be further distributed as needed, and optionally several more reinforcement pieces may be arranged at and proximate to a force applying mechanism of the back plate component, for example, if there is a force applying mechanism arranged at the upper of the back plate component 101, then several more reinforcement pieces 102 may be arranged at upper locations of the back plate component 101.

Figure 3:
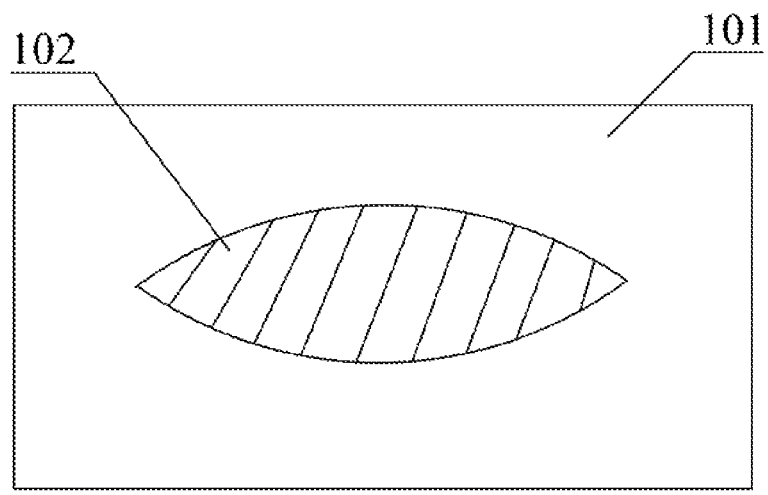
FIG. 3 is a schematic diagram of the shape of a reinforcement piece according to one or more embodiments of the disclosure.
Figure 4:
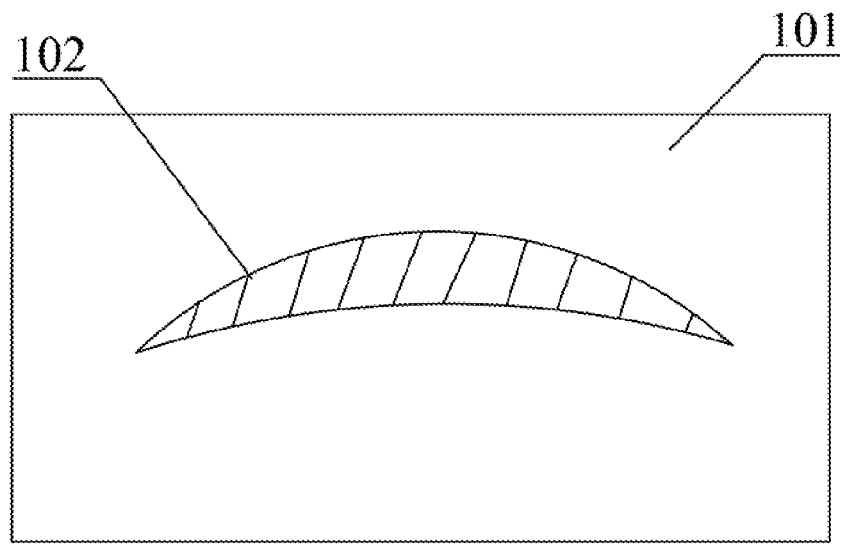
FIG. 4 is a schematic diagram of the shape of another reinforcement piece according to one or more embodiments of the disclosure.
Figure 5:
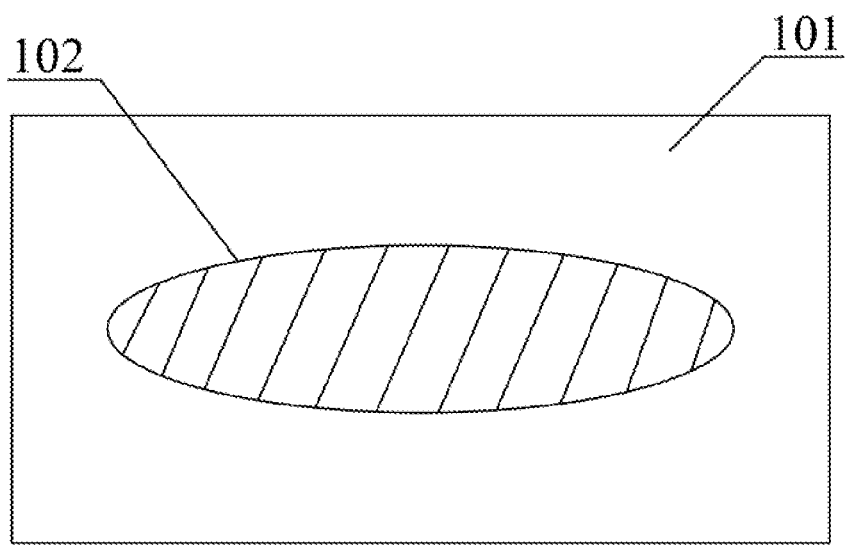
FIG. 5 is a schematic diagram of the shape of still another reinforcement piece according to one or more embodiments of the disclosure.

In one or more embodiments of the disclosure, the shape of the reinforcement piece 102 may be illustrated in FIG. 3 to FIG. 5, for example, the shape of the reinforcement piece 102 may be fusiform, that is, it may be shaped sharp on both of the ends and thick at the middle thereof, or the shape of the reinforcement piece 102 may be meniscus, ellipse, etc., where all of these reinforcement pieces may be left-and-right symmetric with respect to the central axis of the length and decremented in width from the central axis of the length.

In one or more embodiments of the disclosure, the bending strength of the material of the reinforcement piece 102 may be larger than the bending strength of the material of the back plate component 101, or the bending strength of the materials of some of the reinforcement pieces 102 may be larger than the bending strength of the material of the back plate component 101. The bending strength of a material refers to the highest stress that may be withstood by the material being curved until it is broken or reaches a specified bending. The bending strength of the material of the reinforcement piece 102 may be larger than the bending strength of the material of the back plate component 101 so that there may be more influence, by a stress of the reinforcement piece 102, on the back plate component 101 when being curved, to thereby further lower the possibilities of concavity and convexity of the back plate component.

In one or more embodiments of the disclosure, as illustrated in FIG. 1, the number of reinforcement pieces 102 may be larger than three, and illustratively, the number of reinforcement pieces 102 may be six, and the reinforcement pieces 102 may be arranged to be spaced from each other in the width direction of the back plate component 101. The reinforcement pieces 102 may be arranged to be spaced from each other so that a uniform force may be applied to the back plate component to thereby avoid a significant difference in curving of the respective parts of the back plate component 101.

In one or more embodiments of the disclosure, the reinforcement piece 102 may be secured on the back plate component 101 by spot-welding or riveting or screw connection, for example, the reinforcement piece 102 may be spot-welded easily, effectively and firmly, so that the reinforcement piece 102, when being curved, may be prevented from being easily disengaged from the back plate component 101, and moreover the reinforcement piece 102 may alternatively be connected to the back plate component 101 by riveting or screw.

Figure 6:
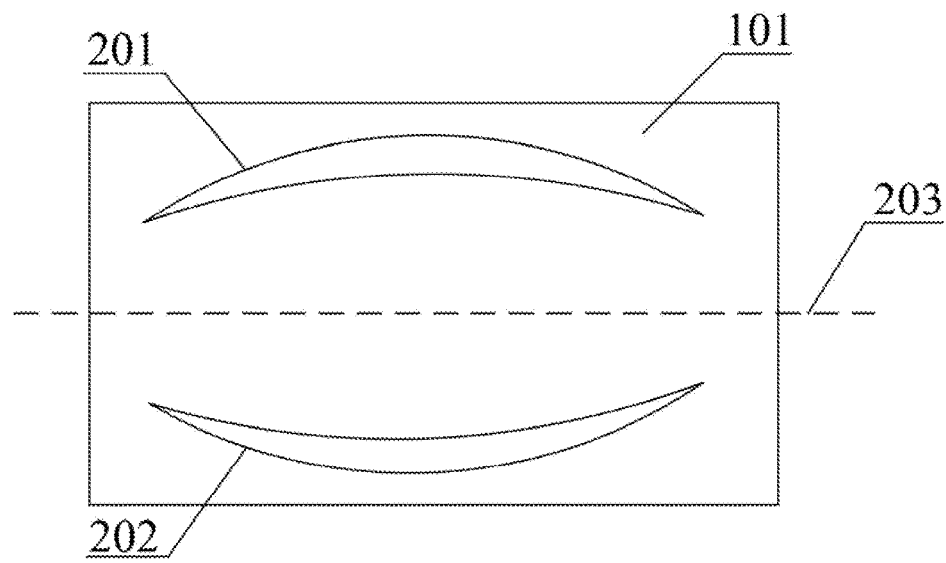
FIG. 6 is a schematic diagram of the back plate component in a planar state according to one or more embodiments of the disclosure.

FIG. 6 illustrates a schematic diagram of the back plate component 101 in a planar state, and in one or more embodiments of the disclosure, the back plate component 101 may be arranged thereon with a first reinforcement piece 201 and a second reinforcement piece 202, both of which are in a meniscus shape, where the first reinforcement piece 201 and the second reinforcement piece 202 may be mirrored symmetric with respect to the central axis 203 of the width of the back plate component 101, which is a central axis perpendicular to the width direction of the back plate component 101 and parallel to the length direction of the back plate component 101.

The first reinforcement piece 201 and the second reinforcement piece 202 may be mirrored symmetric with respect to the central axis 203 of the width, so that a uniform force may be applied to the upper and lower parts of the back plate component 101. Moreover the first reinforcement piece 201 and the second reinforcement piece 202 may be integrated together into a larger combined reinforcement piece.

In one or more embodiments of the disclosure, in order to further save the materials, a recess may be arranged on the center of the reinforcement piece 102, where the shape of the recess may match the outer contour of the reinforcement piece 102 so that the materials may be saved and the essential attribute of the reinforcement piece 102 may be accommodated to thereby ensure the back plate component to be curved smoothly.

In one or more embodiments of the disclosure, the material of the reinforcement piece 102 may be stainless steel due to the high bending strength and fatigue resistance thereof, where the reinforcement piece being applied to the curvature-adjustable display device, e.g., a TV set, etc., may be curved repeatedly without being easily broken so that it may be reused again and again. Particularly the fatigue resistance refers to the highest permissible stress with a metal material to which an alternating load is applied for an indefinite number of times. Moreover the material of the reinforcement piece 102 may alternatively be titanium steel, invar or another alloy with high bending strength and fatigue resistance or the like, and the disclosure will not be limited in this regard.

One or more embodiments of the disclosure further provide a display device which may include a back plate component according to one or more embodiments of the disclosure. The display device of this type may be a curved TV set, which may be a curvature-invariable TV set or a curvature-adjustable TV set. With the back plate component according to one or more embodiments of the disclosure being curved, the curved arc of the curved TV set may be smooth without convexity or concavity or any other defects of being curved.

One or more technical solutions according to the embodiments of the disclosure may achieve at least the following technical effects or advantages:

The back plate component is arranged with the reinforcement pieces on the surface thereof, which are decremented in width from the middle to both of the sides thereof, and a tensile force of the reinforcement piece may be applied to the back plate component being curved in addition to a pushing force of the force applying mechanism applied thereto, so that a uniform force may be applied to the back plate component, and due to the protection from the reinforcement piece, the measurement on the real product and the result of the simulation analysis has demonstrated the optimized curved arc of the back plate component.

Figure 7:
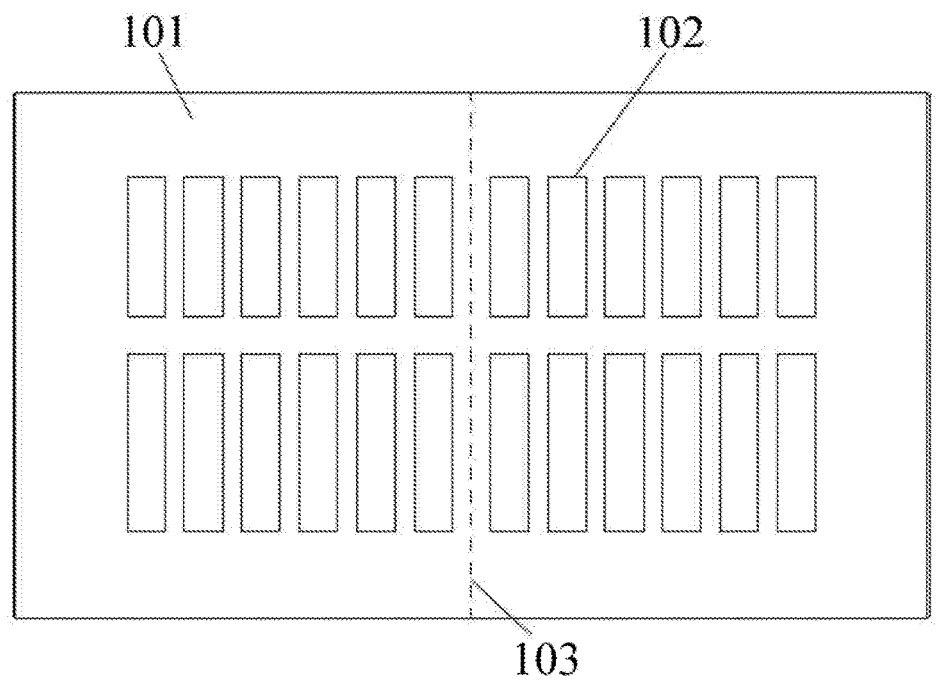
FIG. 7 is a schematic structural diagram of a back plate component according to one or more embodiments of the disclosure.

Moreover in one or more embodiments of the disclosure, as illustrated in FIG. 7, a back plate component applicable to a display device is further provided, where at least one reinforcement piece may be arranged on the back plate component, the length of the reinforcement piece may be no larger than the length of the back plate component, and the width of the reinforcement piece may be no larger than the width of the back plate component; and the length direction of the reinforcement piece may be parallel to the length direction or the width direction of the back plate component, and the width direction of the reinforcement piece may be parallel to the width direction or the length direction of the back plate component. It shall be noted that FIG. 7 illustrates a schematic diagram of only an example of the back plate component, and the back plate component according to one or more embodiments of the disclosure may alternatively be embodied as other structure.

In one or more embodiments of the disclosure, the reinforcement piece may be provided with some length and width, the length direction of the reinforcement piece may be along the length direction of the back plate component, and the width direction of the reinforcement piece may be along the width direction of the back plate component; or the width direction of the reinforcement piece may be along the length direction of the back plate component, and the length direction of the reinforcement piece may be along the width direction of the back plate component. In one or more embodiments of the disclosure, the back plate component may be secured using the reinforcement piece, and the back plate component may be curved using an electro shock, a level, etc., in cooperation.

In one or more embodiments of the disclosure, the number of the reinforcement pieces may be one or more, and when with a plurality of reinforcement pieces, at least a part of the reinforcement pieces may be distributed spaced from each other on the back plate component uniformly or non-uniformly. As illustrated in FIG. 1, for example, the reinforcement piece may be distributed uniformly in the width direction of the back plate component, and moreover the reinforcement piece may be further distributed in the width direction of the back plate component at a density decremented from the middle to both of the sides thereof.

In one or more embodiments of the disclosure, the bending strength of the materials of at least a part of the reinforcement pieces may be no smaller than the bending strength of the material of the back plate component. For example, the bending strength of the materials of only a half of the reinforcement pieces may be no smaller than the bending strength of the material of the back plate component, or the bending strength of the materials of all the reinforcement pieces may be no smaller than the bending strength of the material of the back plate component. The bending strength of a material here has the same meaning as the bending strength of a material mentioned above.

Moreover the thickness of the reinforcement piece may be no larger than the thickness of the display device, and in another example, the thickness of the reinforcement piece may be larger than the thickness of the back plate component, or the thickness of the reinforcement piece may not be larger than the thickness of the back plate component.

In one or more embodiments of the disclosure, at least a part of the reinforcement pieces may be left-and-right symmetric with respect to the central axis of the length of the back plate component (as illustrated in FIG. 7), which is a central axis perpendicular to the length direction of the back plate component and parallel to the width direction of the back plate component. Moreover the widths of at least a part of the reinforcement pieces in the direction of the central axis of the length may be decremented from the middle to both of the sides thereof.

In one or more embodiments of the disclosure, at least a part of the reinforcement pieces may be upper-and-lower symmetric with respect to the central axis of the width of the back plate component (as illustrated in FIG. 6), which is a central axis perpendicular to the width direction of the back plate component and parallel to the length direction of the back plate component. Moreover the lengths of at least a part of the reinforcement pieces in the direction of the central axis of the width may be decremented from the middle to both of the sides thereof.

One or more embodiments of the disclosure further provide a display device including a back plate component, where at least one reinforcement piece may be arranged on the back plate component, the length of the reinforcement piece may be no larger than the length of the back plate component, and the width of the reinforcement piece may be no larger than the width of the back plate component; and the length direction of the reinforcement piece may be parallel to the length direction or the width direction of the back plate component, and the width direction of the reinforcement piece may be parallel to the width direction or the length direction of the back plate component.

In one or more embodiments of the disclosure, the thickness of the reinforcement piece may be no larger than the thickness of the display device. Moreover the thickness of the reinforcement piece may alternatively be no larger than the thickness of the back plate component inside the display device.

Moreover at least a part of the reinforcement pieces may be distributed to be spaced from each other on the back plate component.

Additionally the bending strength of the materials of at least a part of the reinforcement pieces may be no smaller than the bending strength of the material of the back plate component, and the bending strength of a material here has the same meaning as the bending strength of a material mentioned above.

In one or more embodiments of the disclosure, the reinforcement piece may be arranged on one side of the back plate component proximate to a display screen of the display device and/or the other side of the back plate component away from the display screen of the display device.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A back plate component of a curved display device, wherein at least one reinforcement piece is arranged on the back plate component, the at least one reinforcement piece is left-and-right symmetric with respect to a central axis of a length of the back plate component, and a width of the at least one reinforcement piece in a direction of the central axis of the length of the back plate component is decremented from a middle to both of the sides thereof, wherein the central axis of the length of the back plate component is a central axis perpendicular to a length direction of the back plate component and parallel to a width direction of the back plate component.

2. The back plate component according to claim 1, wherein the at least one reinforcement piece is a sheet structure, which has a thickness ranging from 0.6 mm to 1.5 mm.

3. The back plate component according to claim 1, wherein a bending strength of a material of the at least one reinforcement piece is no smaller than that of the back plate component.

4. The back plate component according to claim 1, wherein the number of the at least one reinforcement piece is larger than three, and the at least one reinforcement piece is arranged to be spaced from each other in the width direction of the back plate component.

5. The back plate component according to claim 1, wherein the at least one reinforcement piece is secured to the back plate component by spot-welding or riveting or screw connection.

6. The back plate component according to claim 1, wherein the back plate component is arranged thereon with a first reinforcement piece and a second reinforcement piece, the shapes of which are meniscus, and wherein the first reinforcement piece and the second reinforcement piece are mirrored symmetric with respect to a central axis of the width of the back plate component, which is a central axis perpendicular to the width direction of the back plate component and parallel to the length direction of the back plate component.

7. The back plate component according to claim 1, wherein a recess is arranged on a center of the at least one reinforcement piece, and wherein a shape of the recess matches an outer contour of the reinforcement piece.

8. A back plate component of a curved display device, wherein a plurality of reinforcement pieces are arranged on the back plate component, a length of each of the reinforcement pieces is no larger than a length of the back plate component, and a width of each of the reinforcement pieces is no larger than a width of the back plate component; and a length direction of the reinforcement pieces is parallel to a length direction or a width direction of the back plate component, and a width direction of the reinforcement pieces is parallel to the width direction or the length direction of the back plate component;
wherein the reinforcement pieces are left-and-right symmetric with respect to a central axis of a length of the back plate component, which is a central axis perpendicular to the length direction of the back plate component and parallel to the width direction of the back plate component; and widths of at least a part of the reinforcement pieces in a direction of the central axis of the length of the back plate component are decremented from a middle to both of the sides thereof.

9. The back plate component according to claim 8, wherein at least a part of the reinforcement pieces are arranged to be spaced from each other on the back plate component.

10. The back plate component according to claim 8, wherein a bending strength of materials of at least a part of the reinforcement pieces are no smaller than a bending strength of a material of the back plate component.

11. The back plate component according to claim 8, wherein each of the reinforcement pieces is a sheet structure, which has a thickness ranging from 0.6 mm to 1.5 mm.

12. The back plate component according to claim 8, wherein at least a part of the reinforcement pieces are upper-and-lower symmetric with respect to a central axis of a width of the back plate component, which is a central axis perpendicular to the width direction of the back plate component and parallel to the length direction of the back plate component.

13. The back plate component according to claim 12, wherein lengths of at least a part of the reinforcement pieces in a direction of the central axis of the width are decremented from a middle to both of the sides thereof.

14. A curved display device, comprising a back plate component, wherein at least one reinforcement piece is arranged on the back plate component, the at least one reinforcement piece is left-and-right symmetric with respect to a central axis of a length of the back plate component, and a width of the at least one reinforcement piece in a direction of the central axis of the length of the back plate component is decremented from a middle to both of the sides thereof, wherein the central axis of the length of the back plate component is a central axis perpendicular to a length direction of the back plate component and parallel to a width direction of the back plate component.

15. The curved display device according to claim 14, wherein the at least one reinforcement piece is a sheet structure, which has a thickness ranging from 0.6 mm to 1.5 mm.

16. The curved display device according to claim 14, wherein a bending strength of a material of the at least one reinforcement piece is no smaller than that of the back plate component.

17. The curved display device according to claim 14, wherein the number of the at least one reinforcement piece is larger than three, and the at least one reinforcement piece is arranged to be spaced from each other in the width direction of the back plate component.

18. The curved display device according to claim 14, wherein the reinforcement piece is arranged on one side of the back plate component proximate to a display screen of the curved display device and/or the other side of the back plate component away from the display screen of the curved display device.

* * * * *